(12) United States Patent
Ogata et al.

(10) Patent No.: US 11,107,655 B2
(45) Date of Patent: Aug. 31, 2021

(54) CHARGED PARTICLE BEAM DEVICE

(71) Applicant: Hitachi High-Technologies Corporation, Tokyo (JP)

(72) Inventors: Tomohiko Ogata, Tokyo (JP); Masaki Hasegawa, Tokyo (JP); Katsunori Onuki, Tokyo (JP); Noriyuki Kaneoka, Tokyo (JP); Hisaya Murakoshi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 16/645,649

(22) PCT Filed: Sep. 20, 2017

(86) PCT No.: PCT/JP2017/033854
§ 371 (c)(1),
(2) Date: Mar. 9, 2020

(87) PCT Pub. No.: WO2019/058440
PCT Pub. Date: Mar. 28, 2019

(65) Prior Publication Data
US 2020/0279714 A1    Sep. 3, 2020

(51) Int. Cl.
*H01J 37/24* (2006.01)
*H01J 37/244* (2006.01)
*H01J 37/22* (2006.01)

(52) U.S. Cl.
CPC .......... *H01J 37/222* (2013.01); *H01J 37/244* (2013.01); *H01J 2237/221* (2013.01)

(58) Field of Classification Search
CPC .......... H01J 37/29; H01J 37/265; H01J 37/20; H01J 37/28; H01J 2237/24592;
(Continued)

(56) References Cited

U.S. PATENT DOCUMENTS

2004/0211899 A1* 10/2004 Ezumi .................. H01J 37/265
                                                        250/310
2005/0139772 A1*  6/2005 Hasegawa ............... H01J 37/29
                                                        250/311
(Continued)

FOREIGN PATENT DOCUMENTS

JP    2007-207688 A    8/2007
JP    2013-92530 A     5/2013
(Continued)

OTHER PUBLICATIONS

International Search Report (PCT/ISA/210) issued in PCT Application No. PCT/JP2017/033854 dated Nov. 28, 2017 with English translation (four (4) pages).
(Continued)

*Primary Examiner* — David A Vanore
(74) *Attorney, Agent, or Firm* — Crowell & Moring LLP

(57) ABSTRACT

In order to optimize defect contrast in a charged particle beam device that inverts charged particles directly above a sample and observes the electrons, this charged particle beam device is provided with a charged particle source, an electron gun control device which applies a first voltage to the charged particle source, a substrate voltage control device which applies a second voltage to a sample, an image forming optical system which includes an imaging lens for imaging charged particles incident from the direction of the sample, a detector which includes a camera for detecting the charged particles, and an image processing device which processes the detected signal, wherein the imaging optical system is configured so as not to image secondary electrons emitted from the sample, but forms an image with mirror electrons bounced back by the electric field formed on the sample by means of the potential difference between the first and the second voltages. The image processing device generates a control signal for controlling the potential dif-
(Continued)

ference on the basis of the acquired signal, and optimizes defect contrast by controlling the reflection surface of the mirror electrons.

14 Claims, 13 Drawing Sheets

(58) Field of Classification Search
CPC .... H01J 37/244; H01J 2237/153; H01J 37/21; H01J 2237/0048; H01J 2237/1508; H01J 2237/1536; H01J 2237/221; H01J 2237/24564; H01J 2237/2482; H01J 2237/2538; H01J 2237/2594; H01J 2237/28; H01J 2237/2817; H01J 37/026; H01J 37/04
USPC ...... 250/310, 311, 307, 372, 442.11, 453.11, 250/492.3
See application file for complete search history.

(56) References Cited

U.S. PATENT DOCUMENTS

| | | | |
|---|---|---|---|
| 2006/0011835 A1* | 1/2006 | Murakoshi | H01J 37/147 250/310 |
| 2007/0181808 A1* | 8/2007 | Murakoshi | H01J 37/29 250/310 |
| 2008/0315093 A1* | 12/2008 | Hasegawa | G01N 23/225 250/310 |
| 2009/0039264 A1* | 2/2009 | Ikegami | H01J 37/28 250/311 |
| 2010/0181480 A1* | 7/2010 | Shimakura | H01J 37/026 250/310 |
| 2011/0284746 A1* | 11/2011 | Shimakura | H01J 37/29 250/310 |
| 2014/0042338 A1* | 2/2014 | Shibata | H01J 37/20 250/453.11 |
| 2016/0133433 A1* | 5/2016 | Fujita | H01J 37/18 250/492.3 |
| 2016/0203946 A1* | 7/2016 | Hasegawa | H01J 37/265 250/310 |
| 2017/0250054 A1* | 8/2017 | Takahashi | H01J 37/261 |
| 2018/0025888 A1* | 1/2018 | Shichi | H01J 37/08 250/307 |
| 2019/0108969 A1* | 4/2019 | Ogata | H01J 37/04 |
| 2019/0378685 A1* | 12/2019 | Hasegawa | H01J 37/20 |
| 2020/0152415 A1* | 5/2020 | Ogata | H01J 37/22 |
| 2020/0279714 A1* | 9/2020 | Ogata | H01J 37/244 |
| 2020/0292466 A1* | 9/2020 | Hasegawa | G01N 23/203 |
| 2020/0340930 A1* | 10/2020 | Ohira | G01N 23/2251 |

FOREIGN PATENT DOCUMENTS

| | | |
|---|---|---|
| JP | 5744248 B2 | 7/2016 |
| WO | WO 2016/002003 A1 | 1/2016 |

OTHER PUBLICATIONS

Japanese-language Written Opinion (PCT/ISA/237) issued in PCT Application No. PCT/JP2017/033854 dated Nov. 28, 2017 (six (6) pages).

Shinada, et al., "Mirror Electron Microscope Technology Having Possibilities of High-Speed and Highly Sensitive Inspection", Hitachi Review, Feb. 1, 2012, pp. 46-51, vol. 94, No. 2, with English translation (13 pages).

German-language Office Action issued in German Application No. 11 2017 007 862.8 dated Apr. 27, 2020 with English translation (12 pages).

* cited by examiner

CHARGED PARTICLE BEAM DEVICE

TECHNICAL FIELD

The present invention relates to a charged particle beam device and a method for adjusting the charged particle beam device, and more particularly to a technique suitable to stably acquire a high-resolution image in a microscope using charged particles that have been reflected immediately before a sample and are in a mirror state.

BACKGROUND ART

A charged particle beam device is configured to emit a charged particle beam released from a charged particle source toward a sample. The charged particle beam is an electron beam, an ion beam, or the like. Among such devices, there is a device having an irradiating optical column and an imaging optical column. Especially, an electron microscope, which has a mechanism for using electrons as charged particles to apply a negative potential lower than an accelerating potential to a sample, causing an electron beam to be reflected immediately before the sample, using the reflected electrons to perform imaging, is referred to as a mirror electron microscope. In the mirror electron microscope, a method for adjusting an accelerating potential and a sample potential is important, and setting the potentials to appropriate potentials contributes to an improvement in the resolution and contrast of a target to be observed.

Patent Literature 1 discloses a mirror electron microscope technique for controlling a reflection surface to improve the contrast of a target defect and a technique for using an energy filter to control an energy distribution of an electron beam emitted by an electron source to improve the contrast of the defect. In addition, Patent Literature 2 discloses a technique for controlling an accelerating potential of an electron beam and a sample potential to improve the contrast of a charged sample image famed using mirror electrons and secondary electrons.

CITATION LIST

Patent Literature

Patent Literature 1: Japanese Patent Application Laid-Open No. 2007-207688
Patent Literature 2: Japanese Patent No. 5744248

SUMMARY OF INVENTION

Technical Problem

However, in a method disclosed in Patent Literature 1, to set a sample potential for an optimal reflection surface, it is necessary that a result determined by a person viewing an image be input to a device, and there is a problem that variations occur among people. The method disclosed in Patent Literature 2 is to control a reflection surface via an image acquisition method using secondary electrons and mirror electrons and is not a method for improving the contrast of an image actively using an image formed using only mirror electrons. Furthermore, Patent Literature 2 describes the fact that a region in which mirror electrons and secondary electrons exist is excellent. Patent Literature 2, however, does not disclose a method for selecting an optimal value for the region and does not disclose a method for automatically adjusting a reflection surface in order to perform imaging under the best conditions.

An object of the invention is to provide a charged particle beam device that can solve the foregoing problems, control a reflection surface based on a signal able to be acquired by a device, and optimize the contrast of a defect.

Solution to Problem

To achieve the object, according to the invention, a charged particle beam device includes a charged particle source that emits charged particles, a first power source that applies a first voltage to the charged particle source, a second power source that applies a second voltage to a sample, an imaging optical system that images charged particles incident from a direction in which the sample exists, and a detector that is installed in the imaging optical system and detects the charged particles. The imaging optical system is configured so that the imaging optical system does not image secondary electrons released from the sample and foams an image of mirror electrons returned by an electric field generated at the sample due to a potential difference between the first and second voltages.

Advantageous Effects of Invention

According to the invention, it is possible to perform adjustment with high accuracy by automatically controlling a reflection surface based on a signal able to be acquired by a device, regardless of a difference between devices.

DESCRIPTION OF EMBODIMENTS

Figure 1:
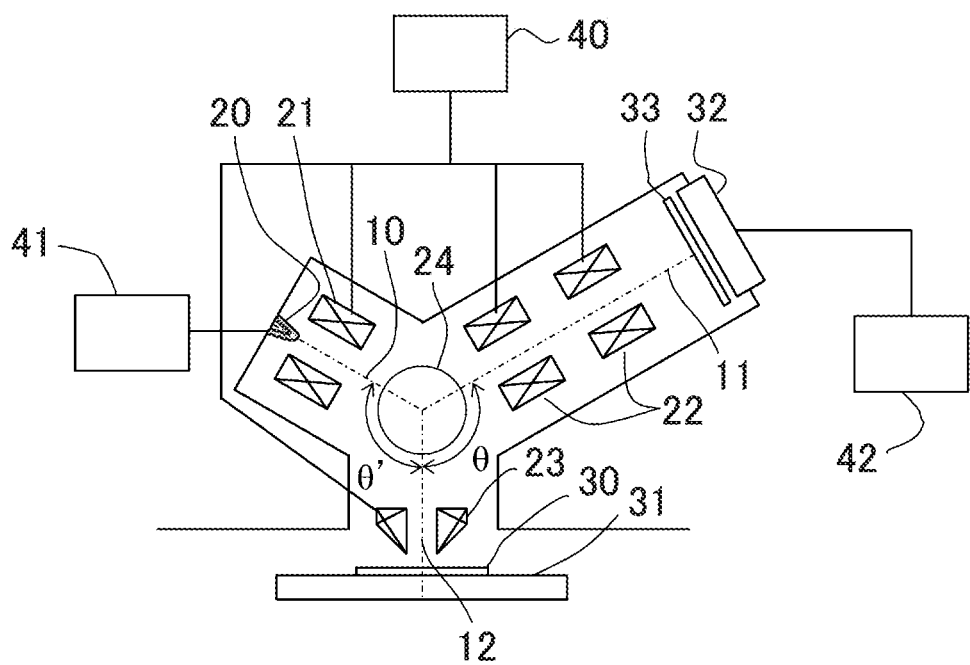
FIG. 1 is a diagram illustrating an example of a charged particle beam device having two optical systems.

A process of manufacturing a semiconductor device includes a process of forming a fine circuit on a wafer polished to have a mirror surface and including a material, which is Si, SiC, or the like. When a foreign matter, a scratch, or a crystal defect exists on the wafer, a defect or substance degradation may occur in a process of forming a circuit pattern, the manufactured device may not normally operate, a desired electric characteristic may not be obtained, and the reliability of an operation may be reduced.

Some of devices for inspecting wafers are a light scattering type inspection device that inspects the state of a surface of a wafer by emitting light (hereinafter merely referred to as light) having wavelengths in a range from a visible wavelength to an ultraviolet wavelength to the surface of the wafer and detecting light scattered on the surface, and an inspection device that uses an optical microscopic technique such as differential interference. However, with the progress of miniaturization of semiconductor elements, it is necessary to manage fine foreign matters from which scattering intensities sufficient for detection are not obtained. In addition, it is becoming clear that crystal defects that cannot be imaged by an optical microscope affect the reliability characteristics of semiconductor devices, and an optical inspection device cannot be used for advanced quality management in some cases.

As a device for detecting a foreign matter or defect that is hardly detected by an optical inspection device, an electron microscope exists. The electron microscope has extremely high spatial resolution and can acquire an image of a foreign matter with a size of 20 nanometers or less, which significantly reduces a light scattering intensity. In addition, since an electron beam is charged particles, the electron microscope uses an electric characteristic of a crystal defect to detect the defect, which cannot be detected using light. Although the electron microscope can acquire an image within a practical time period in observation in a micrometer-size field of view, a long observation time period is required to thoroughly observe an entire surface of a wafer as a semiconductor substrate in order to inspect the entire surface of the wafer. For example, when an entire surface of an Si wafer with a diameter of 100 millimeters is inspected with resolution of approximately 10 nanometers, and estimation is performed under standard conditions, a time period of approximately 6 days is required for a scanning electron microscope.

Thus, a mapping electron microscope has been proposed to increase an inspection speed. Specifically, an electron device detects a signal obtained by emitting an electron beam or a charged particle beam toward a sample, applies a negative potential equal to or slightly higher than an accelerating voltage of the emitted electron beam to a wafer surface, causes the electron beam, which has been emitted in nearly parallel onto a field of view of an inspection on the wafer surface at an angle perpendicular to the wafer surface, to be reflected directly above the wafer surface at an angle of approximately 180 degrees with respect to an incident direction of the beam, and forms an image of the reflected electrons (hereinafter referred to as mirror electrons) on an electron lens to acquire the electron image for inspection.

An example of a configuration of the mirror electron microscope for generating an image based on detection of mirror electrons is described below with reference to FIG. 1. A sample is placed so that a sample surface direction is perpendicular to an optical axis 12 of an objective lens that is an ideal optical axis of a beam. Electrons released from an electron gun 20 are accelerated by an acceleration electrode not illustrated or the like and form an electron beam. The electron beam is focused by an irradiation lens 21 and passes through an optical axis 10. The electron beam focused by the irradiation lens 21 is deflected by a beam separator 24 so that the electron beam moves along a trajectory of the optical axis 12 of the objective lens. The emitted electron beam is focused on a back focal surface of the objective lens 23 and directed toward a sample 30. An opening angle of the electron beam deflected by the beam separator 24 is adjusted by the objective lens 23 so that the electron beam is a parallel beam. Then, the electron beam is moved along the optical axis 12 of the objective lens toward the sample 30 at a right angle with respect to the sample 30. A negative voltage is applied to the sample 30 or a stage 31 from a negative voltage application power source not illustrated. The negative voltage applied from the negative voltage application power source is nearly equal to or slightly higher than an accelerating voltage applied between a chip of the electron gun 20 and the acceleration electrode, and the electron beam is reflected toward an imaging element without reaching the sample 30. Since the emitted electron beam does not reach the sample 30, an image in which a potential distribution (equipotential surface) on the sample is reflected can be acquired, instead of an image of a sample surface shape. After the reflected electron beam passes through the optical axis of the objective lens, the reflected electron beam passes through the beam separator 24 adjusted so that an optical axis 11 of the imaging lens is the same as a trajectory of the electron beam. After passing through the beam separator, the electron beam passes through the center of the imaging lens 22 and forms an image on a scintillator 33. A camera 32 is a two-dimensional imaging element that images the scintillator that has emitted light due to the incidence of the electron beam. The camera 32 can acquire a signal to image the potential distribution on the sample.

In the foregoing mirror electron microscope, the contrast of a captured image varies depending on a position where electrons are reflected. A voltage is applied between the objective lens 23 and the sample 30 so that a potential difference occurs. A distortion occurs on the equipotential surface due to an irregularity or charging of the sample. In the case where electrons are reflected on the equipotential surface to serve as mirror electrons, an image corresponding to the distortion on the equipotential surface is famed on the scintillator 33 and captured by the camera 32. When the accelerating voltage of the electron beam or the value of a voltage applied to the sample 30 is changed, the position of the equipotential surface on which electrons are reflected changes. Since the size of the distortion formed on the equipotential surface varies depending on a distance from the irregularity or a charged portion, the image observed changes with the change in the applied voltage. Basically, as the equipotential surface on which electrons are reflected are closer to the sample, a change in the distortion is larger and the contrast of a fine defect is more easily obtained. However, the electron beam basically has a wide range of energy. When the equipotential surface is too close to the sample, the probability that the electron beam collides with the sample increases. Thus, the quantity of electrons that reach the scintillator 33 as mirror electrons decreases and the quantity of signals foaming an image decreases. As a result, the contrast of the defect decreases. It is, therefore, important to find an optimal value of a set voltage for a target defect.

The mirror electrons reflected due to the distortion, caused by the irregularity or charging, of the equipotential surface are focused by an imaging system and form an image on the scintillator. However, in a mirror electron microscope image captured by the imaging system, which is set so that mirror electrons reflected due to the distortion, caused by the irregularity or the charged portion, of the equipotential surface are focused onto a single point, a fine defect is imaged so that the defect on the image is small. In the image, the contrast is high, but the defect is small. To inspect a defect with high throughput, it is necessary to find the fine defect in a wide field of view. It is, therefore, necessary to perform imaging under the condition that the distortion of the equipotential surface is enlarged.

According to the invention, a charged particle beam device, which appropriately sets an accelerating potential of an electron beam and a sample potential in order to detect a fine defect with high accuracy and enables the fine defect to be found in a wide field of view, is proposed. Before embodiments of the invention are described, a basic configuration and operating principle of the invention are described.

A charged particle beam device according to the invention includes a charged particle source that emits charged particles, a first power source that applies a first voltage to the charged particle source, a second power source that applies a second voltage to a sample, an imaging optical system that images charged particles incident from a direction in which the sample exists, and a detector that is installed in the imaging optical system and detects the charged particles. The imaging optical system is configured so that the imaging optical system does not form an image of secondary electrons released from the sample and forms an image of mirror electrons returned by an electric field generated at the sample due to a potential difference between the first and second voltages. Specifically, according to the invention, an electron microscope and a defect detection device use an ultraviolet light source to charge a defective portion, detect a distortion of an equipotential surface formed by the charging, appropriately set an accelerating voltage of an electron beam or a sample potential, and use an objective lens and an imaging system to defocus the electron beam reflected on the distortion of the equipotential surface, thereby enlarging an image of the defective portion with respect to the actual size of the defect, setting conditions in which the defect can be imaged with high contrast, and easily extracting the defect of the sample.

Figure 2:
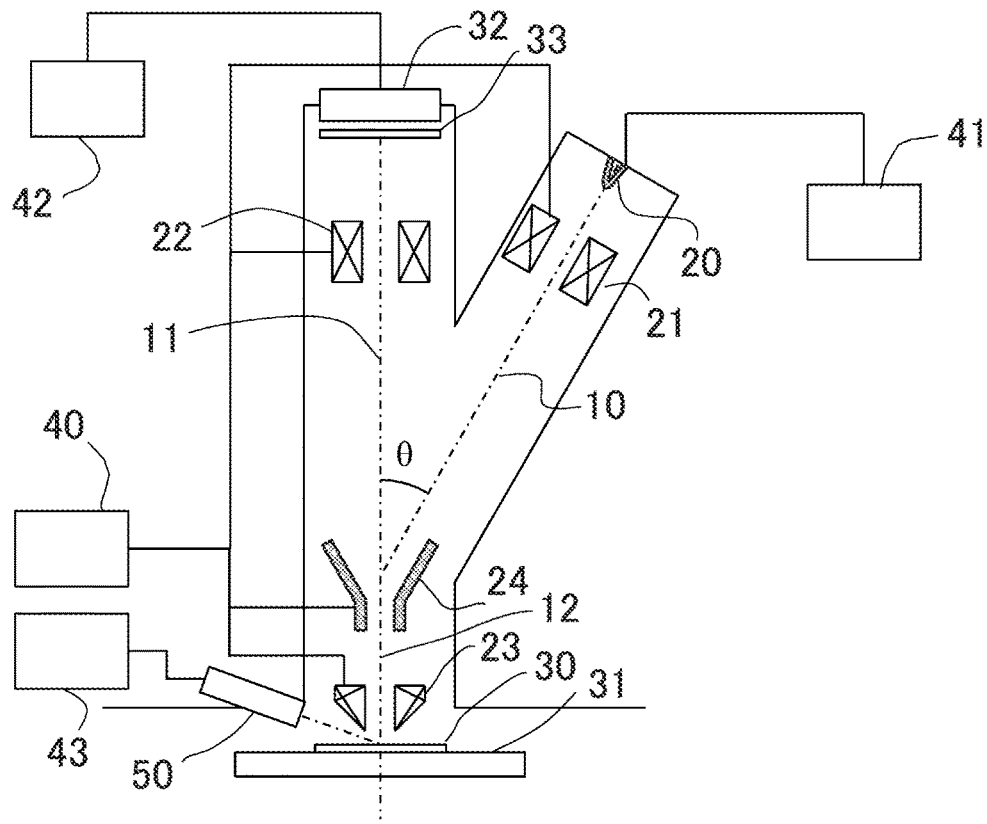
FIG. 2 is a diagram illustrating a basic configuration of a charged particle beam device according to the invention.

The basic configuration and operating principle of the invention are described below with reference to the drawings. In the following description, however, the same constituent elements are indicated by the same reference sign, and repetitive description is omitted in some cases. FIG. 2 is a diagram illustrating an example of a configuration of a mirror electron microscope according to the invention. In the mirror electron microscope, an electron beam released from the electron gun 20 is focused by the irradiation lens 21, introduced toward the optical axis 12 of the objective lens via the beam separator 24, and changed to parallel light by the objective lens 23. The optical axis 12 is perpendicular to the sample. A voltage equal to or slightly higher than an accelerating voltage of the electron gun is applied to the sample 30 via the stage 31. The electron beam is reflected directly above the sample 30. The reflected electron beam is introduced by the beam separator 24 to the optical axis 11 of the imaging system and projected onto an imaging lens 22 to form an enlarged image on the scintillator 33. The scintillator 33 converts the electron beam image into an optical image. The optical image is acquired by the camera 32. The acquired image is transferred to an image acquiring device 42, subjected to various image processing, and displayed and used by an image display unit of the device. An electron gun control device 41 controls the accelerating voltage of the electron beam, a control device 40 controls a current and a voltage for an electron lens, and an ultraviolet light source control device 44 controls a light amount of an ultraviolet light source 50.

Figures 3A, 3B, 3C:
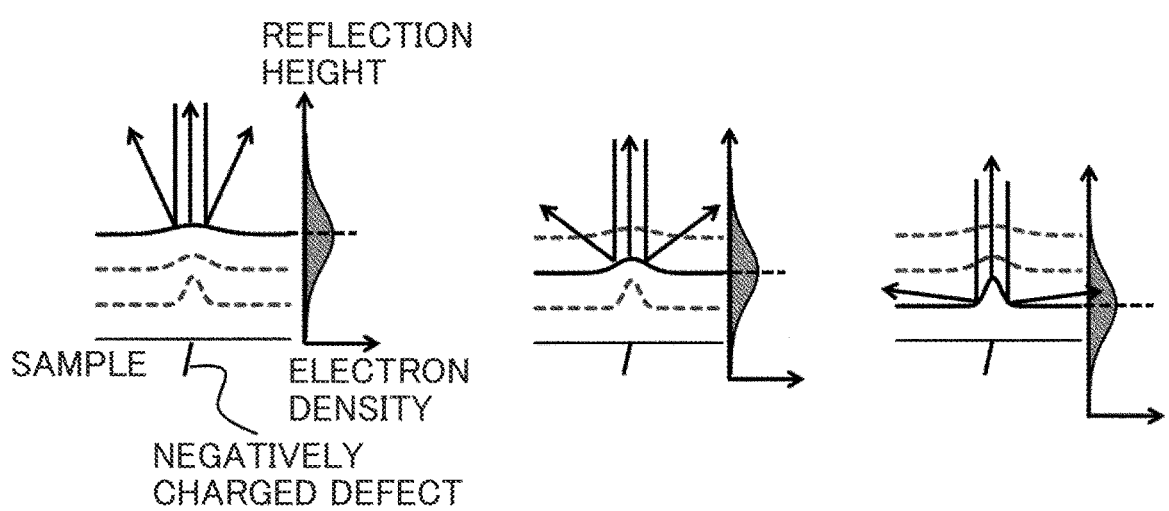
FIGS. 3A to 3C are diagrams illustrating a reflection height to which mirror electrons are reflected from a negatively charged defect and angles at which the mirror electrons are reflected.

FIG. 3 are diagrams describing how emitted electrons parallelized by the objective lens 23 are reflected above a defect negatively charged by an ultraviolet beam. FIG. 3(a) illustrates the case where an equipotential surface on which the electron beam is reflected above the sample, or a reflection surface, is separated from the sample. On the right side of the equipotential surface in the Fig., an example of a distribution in which an abscissa indicates the density of electrons and an ordinate indicates a reflection height to which the electrons are reflected is illustrated. In addition, the reflection surface illustrated is a surface on which the quantity of electrons reflected is the largest. A defect negatively charged by an ultraviolet beam forms a distortion on the equipotential surface. Electrons are reflected on the distortion formed on the equipotential surface at angles with respect to an incidence direction of the emitted electrons, without being reflected in the completely opposite direction to the incidence direction of the emitted electrons. FIG. 3(b) illustrates the reflection of electrons in the case where the accelerating voltage of the electron gun is changed to the negative side or the sample potential is changed to the positive side and the reflection surface is closer to the sample than the case illustrated in FIG. 3(a). Since the reflection surface is close to the sample, the distortion formed on the reflection surface is larger and angles at which electrons are reflected are larger than those in the case illustrated in FIG. 3(a). FIG. 3(c) is a diagram illustrating the case where the accelerating voltage of the electron gun is further changed to the negative side, compared to the case illustrated in FIG. 3(b) or the sample potential is further changed to the positive side, compared to the case illustrated in FIG. 3(b) and the reflection surface is closer to the sample than the case illustrated in FIG. 3(b). In this case, angles at which electrons are reflected are larger than those in the case illustrated in FIG. 3(b), but electrons that are under the sample in a distribution of reflected electrons are not reflected and collide with the sample. The electrons do not contribute to the contrast of an image as mirror electrons and may form secondary electrons and degrade the contrast of the image formed as a mirror electron image.

Mirror electrons reflected at angles are focused by an imaging lens such as the imaging lens 22. In this case, when electrons reflected at an angle on the distortion formed on the equipotential surface due to the defect to be observed are focused, the electrons are displayed on the scintillator as a single bright spot for the single distortion. This is equivalent to the fact that the distortion formed on the equipotential surface due to the defect acts as a single lens and that a virtual light source is imaged and displayed. In this case, an image of the fine defect is displayed as a much smaller image than a viewing field of several tens of micrometers to several hundreds of micrometers. When a high-resolution camera is used, there is not a problem. However, when a low-resolution camera is used, and a high-contrast image is acquired for a portion of a single pixel, a signal input to the pixel is averaged and displayed as a low-contrast dot.

First Embodiment

A first embodiment is an embodiment of a mirror electron microscope having a configuration for easily detecting a defect in consideration of the challenges for the foregoing principle configuration. Specifically, The mirror electron microscope includes a charged particle source that emits charged particles, a first power source that applies a first voltage to the charged particle source, a second power source that applies a second voltage to a sample, an imaging optical system that images charged particles incident from a direction in which the sample exists, and a detector that is installed in the imaging optical system and detects the charged particles. The imaging optical system is configured so that the imaging optical system does not image secondary electrons released from the sample and forms an image of mirror electrons returned by an electric field generated at the sample due to a potential difference between the first and second voltages.

Figure 4:
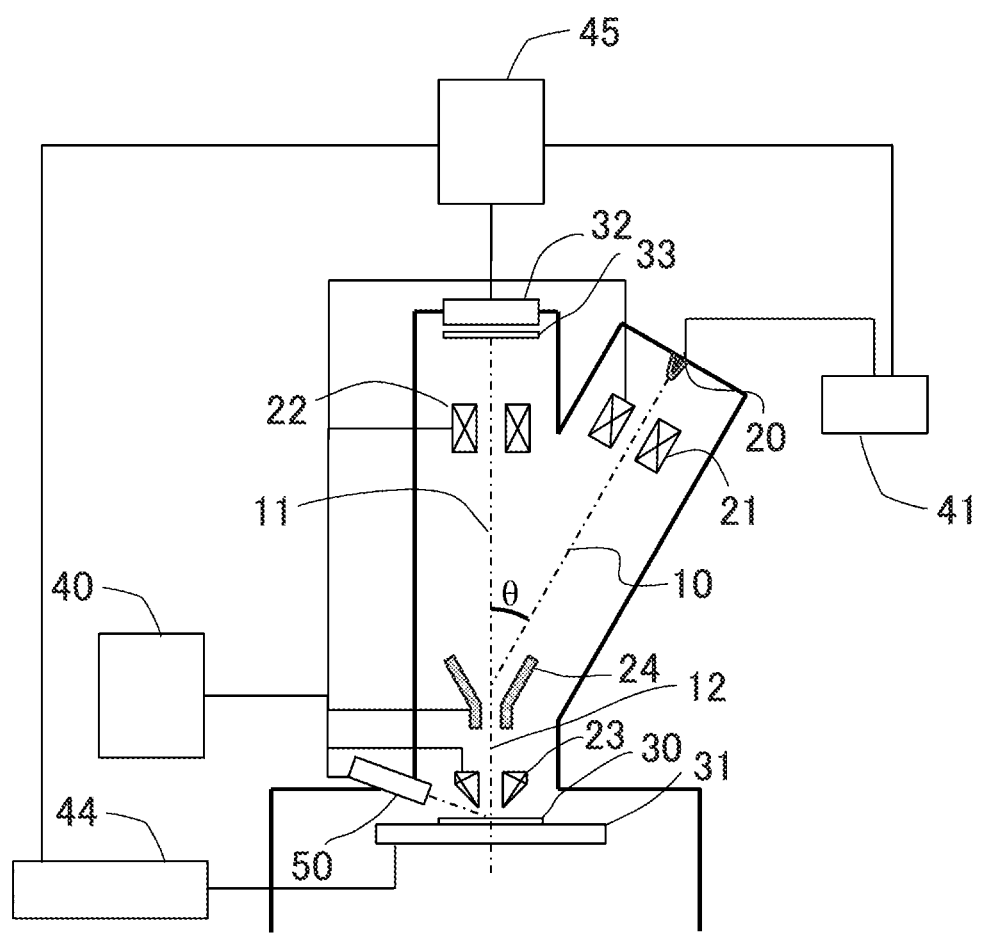
FIG. 4 is a diagram illustrating a charged particle beam device having two optical systems according to a first embodiment.

An example of a configuration of the device according to the first embodiment is described with reference to FIG. 4. In the configuration according to the present embodiment, an image captured by the camera 32 is transferred to the image processing device 45, differently from the device configuration illustrated in FIG. 2. After that, the image processing device 45 processes the transferred image and transmits a control parameter calculated as a result of the processing to the electron gun control device 41 or the substrate voltage control device 44. In addition, the image processing device 45 outputs various obtained image data to an image display unit. The image processing device is enabled by causing a central processing unit (CPU) of a computer for controlling the entire charged particle beam device to execute a program or is enabled by a hardware configuration such as a dedicated image processing circuit. As the image display unit, a display of the computer may be used.

The electron gun control device 41 or the substrate voltage control device 44 controls the accelerating voltage of the electron gun 20 or the sample potential based on the transmitted control parameter. As a result of the control, each of low-contrast images of mirror electrons from a defect as illustrated in FIGS. 3(a) and 3(c) can be changed to such a high-contrast image as illustrated in FIG. 3(b). In this case, the voltages of the units controlled by the control device 40 and the like may be changed or may not be changed. In this manner, the image processing device 45 according to the present embodiment calculates the control parameter for adjusting a potential difference between first and second voltages based on the potential difference between the first voltage that is the accelerating voltage of the electron gun and the second voltage that causes the sample potential, and a distribution of amounts of signals detected by a detector composed of the scintillator, for example, average image luminance for a mirror electron image. The image processing device 45 according to the present embodiment adjusts the difference $\Delta E$ between the accelerating voltage and the sample potential based on the control parameter.

Figure 5:
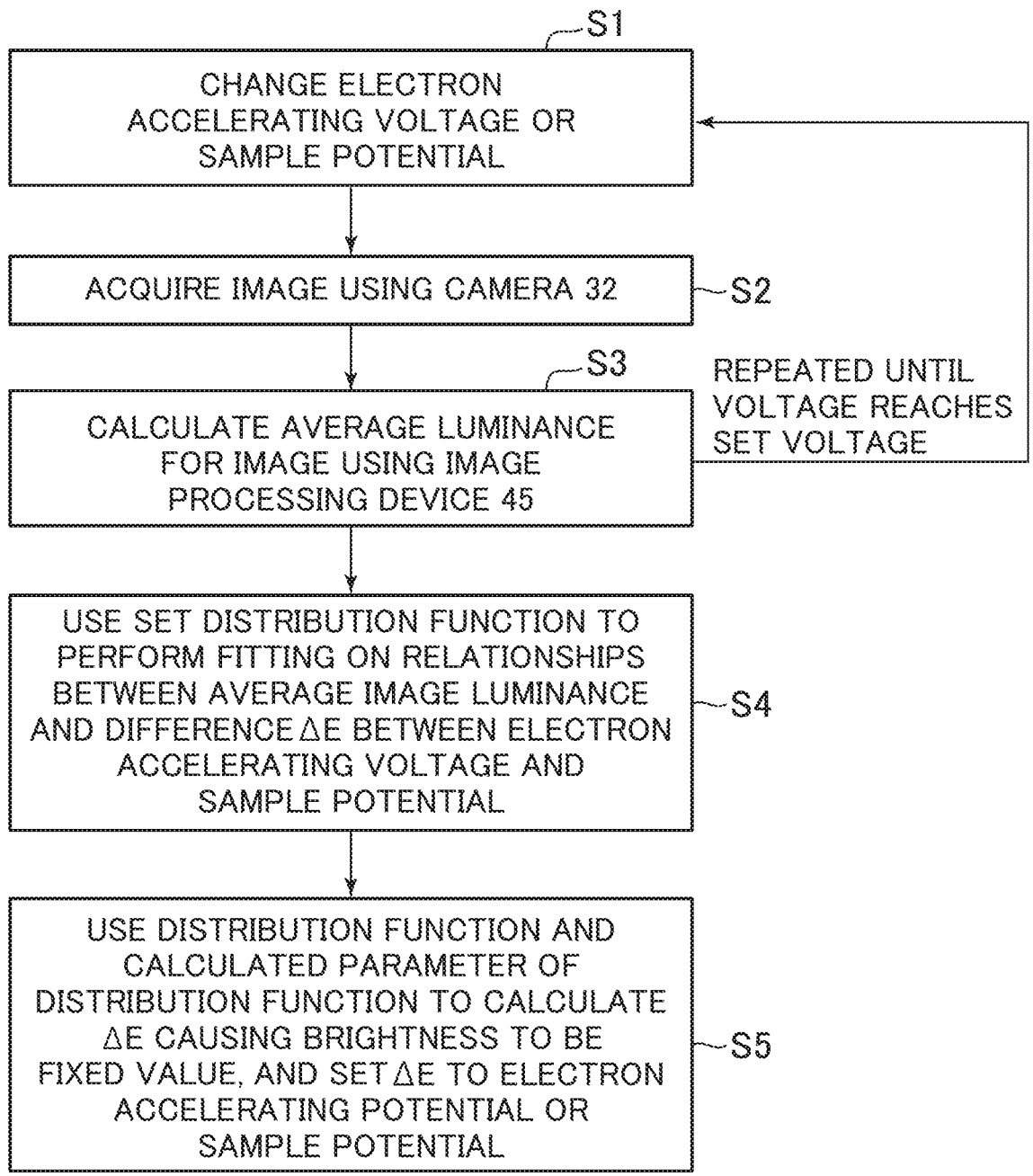
FIG. 5 is a flowchart of a method for adjusting a difference ΔE between an accelerating voltage and a sample potential according to the first embodiment.

Specific details of a method for adjusting the difference $\Delta E$ between the accelerating voltage and the sample potential are executed by the image processing device 45 according to the present embodiment and described with reference to a flowchart illustrated in FIG. 5. The flowchart is executed by causing the foregoing CPU to execute the program. As step 1 (S1, the same applies the following), the electron accelerating voltage or the sample potential is changed by the electron gun control device 41 or the substrate voltage control device 44. Next, a mirror electron image foiled on the scintillator 33 is captured and acquired by the camera 32 (in S2). This case assumes that various control parameters are not changed by the control device 40. Next, average luminance for the captured image is calculated by the image processing device 45 (in S3). The average image luminance may be calculated using a portion of the image or using the entire image. It is, however, preferable that all image regions from which the image is captured and the average image luminance is calculated while the accelerating voltage or the sample potential is changed be the same. In S1 to S3, the electron accelerating voltage or the substrate voltage are changed in set ranges, images are acquired for all set voltages, average image luminance is calculated, and a distribution of amounts of signals detected by the detector is foamed.

Subsequently, acquired relationships between the average image luminance and the difference $\Delta E$ between the electron accelerating voltage and the sample potential are subjected to fitting using a set distribution function (in S4). It is preferable that the distribution function causes the sample potential to uniquely correspond to brightness. For example, as described later, the fitting is performed using the distribution function such as a Fermi distribution function or a differential function of the Fermi distribution function. As described later, the image processing device 45 can change the distribution function based on the type of the charged particle source, change the distribution function based on information of the charged particle source, such as a voltage applied to the charged particle source or a current supplied to the charged particle source, and change the distribution function based on a target that is on the sample and is to be observed.

Lastly, ΔE that causes the brightness to be a fixed value is calculated using the set distribution function and a calculated parameter of the distribution function, and the calculated ΔE is set to the electron accelerating potential or the sample potential (in S5). The brightness is stored as an absolute value or a relative value so that the contrast of the defect is the same as contrast desired by a user. According to the present embodiment, the brightness as a standard is stored and the parameter of the distribution function is calculated from data of the acquired luminance, and thus the set voltage can be uniquely determined.

Figure 6:
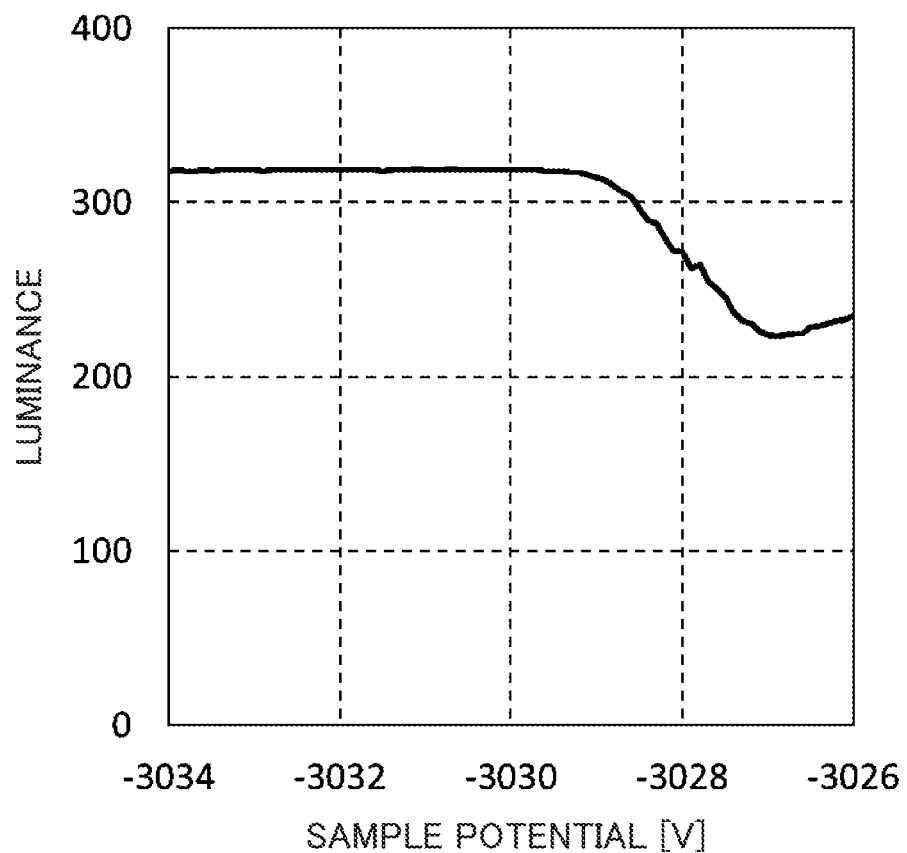
FIG. 6 is a diagram illustrating relationships between the sample potential and average image luminance under the condition that the accelerating voltage is fixed according to the first embodiment.

FIG. 6 illustrates an example of actually obtained relationships between ΔE and luminance. In this Fig., an abscissa indicates the sample potential (V) and an ordinate indicates the luminance. In the present embodiment, average image luminance is acquired, while only the sample potential is changed under the condition that the electron accelerating voltage is fixed. As illustrated in this Fig., when the sample potential is in a range from −3034V to −3029V, the image luminance hardly changes. It is apparent that, in this range, almost 100% of electrons emitted toward the sample are reflected, form mirror electrons, and move to the imaging system. When the sample potential is higher than −3029V, some of the emitted electrons start colliding with the sample. The luminance decreases when the sample potential increases to −3027V. After that, the luminance increases. It is considered that the reason why the luminance increases when the potential is higher than −3027V is that secondary electrons may be generated and electrons may be reflected upon the collision of emitted electrons with the substrate and may move to the imaging system. According to this graph, it is considered that the electron beam having a wide range of energy starts colliding with the sample when the sample potential is approximately −3029V and that the ratio of the quantity of electrons that collide with the sample increases as the sample potential increases.

Figure 7A:
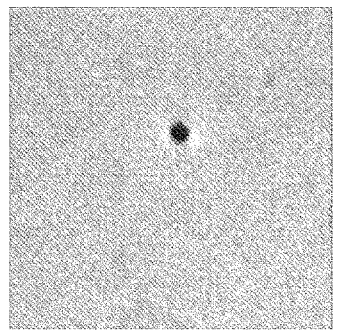
FIGS. 7A to 7C are diagrams illustrating how negatively charged defects are viewed in the case where the sample potential is changed under the condition that the accelerating voltage is fixed according to the first embodiment.
Figure 7B:
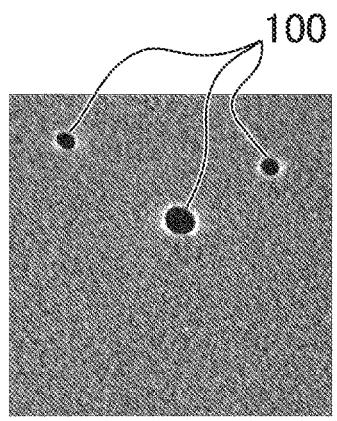
Figure 7C:
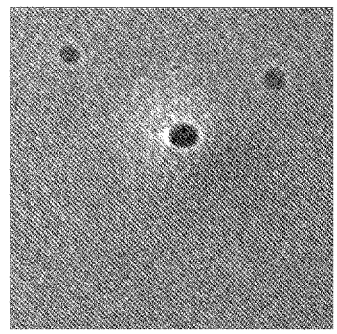

FIG. 7 illustrate relationships between ΔE and a defect image. FIG. 7(a) illustrates a mirror electron microscope image captured when the sample potential is in a range of −3034V to −3027V and the image luminance is almost zero in FIG. 6. An SiC substrate is used as the sample to be imaged, and a crystal defect exists in the substrate. A black portion viewed in a region close to the center of a field of view is a mirror electron microscope image of a defect 100 existing in the sample. Under the conditions in the case illustrated in FIG. 7(a), a region around the black portion blurs and the entire image also blurs. FIG. 7(b) illustrates a mirror electron microscope image acquired when the sample potential is slightly higher than −3029V. White portions are viewed around black portions, the contrast is high, and a portion of a defect that cannot be viewed in the case illustrated in FIG. 7(a) can be observed. This may be because the reflection surface on which the electron beam is reflected above the sample is close to the sample and a distortion of the reflection surface that is formed due to a defective charged portion is steep. When the sample potential is further increased and higher than that in the case illustrated in FIG. 7(b) and is approximately −3027V, a defect image can be viewed as illustrated in FIG. 7(c). In this range, the ratio of the quantity of electrons emitted toward the sample and serving as mirror electrons significantly decreases from 100%, and thus average image luminance is low. In addition, a large amount of secondary electrons generated upon collision with the sample and a large amount of reflected electrons are returned to the imaging system via trajectories different from trajectories of the mirror electrons. Thus, the returned electrons cause a decrease in the contrast of the mirror electron image. Therefore, it is not preferable to capture a mirror electron image under the condition in the case of FIG. 7(c).

Figure 8:
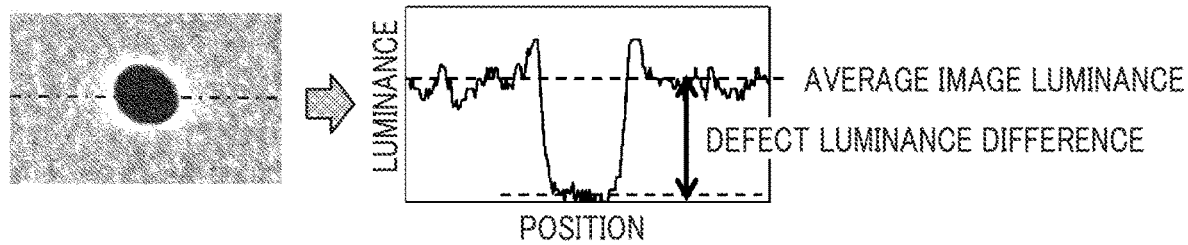
FIG. 8 is a diagram illustrating a definition of defect contrast in a mirror electron microscope image according to the first embodiment.

To quantitatively describe the images illustrated in FIG. 7, defect contrast is defined as illustrated in FIG. 8. As illustrated on the left side of FIG. 8, to blacken a defective portion, for example, it is necessary to capture an image under a defocusing condition in which an imaging surface is placed in front of the scintillator for a negatively charged defective portion. Otherwise, the defective portion is a white bright spot, and the size of the bright spot is smaller than a distortion of the reflection surface that is formed due to the charged defective portion. In this state, since a contrast portion of the defective portion does not have an area and it is difficult to subsequently automatically extract the defective portion, it is preferable that the imaging system image a target defect in the extraction of the defect under a defocusing condition. As the defocusing condition, for example, it is suitable that the defocusing is performed in a state in which a focal surface is separated from the scintillator 33 by 10 mm or more. The scintillator 33 serves as the detector. Since the defocusing condition is set, the control device 40 adjusts the current and the voltage for the imaging lens 22 and the objective lens 23.

When a defective charged portion is imaged under the defocusing condition, and a profile of a defect illustrated on the left side of FIG. 8 is obtained, the profile is such a profile as illustrated on the right side of FIG. 8. Then, a difference between obtained average image luminance as a standard and a black portion of a defect image is defined as a defect luminance difference. In this case, defect contrast is defined as follows.

Figure 9:
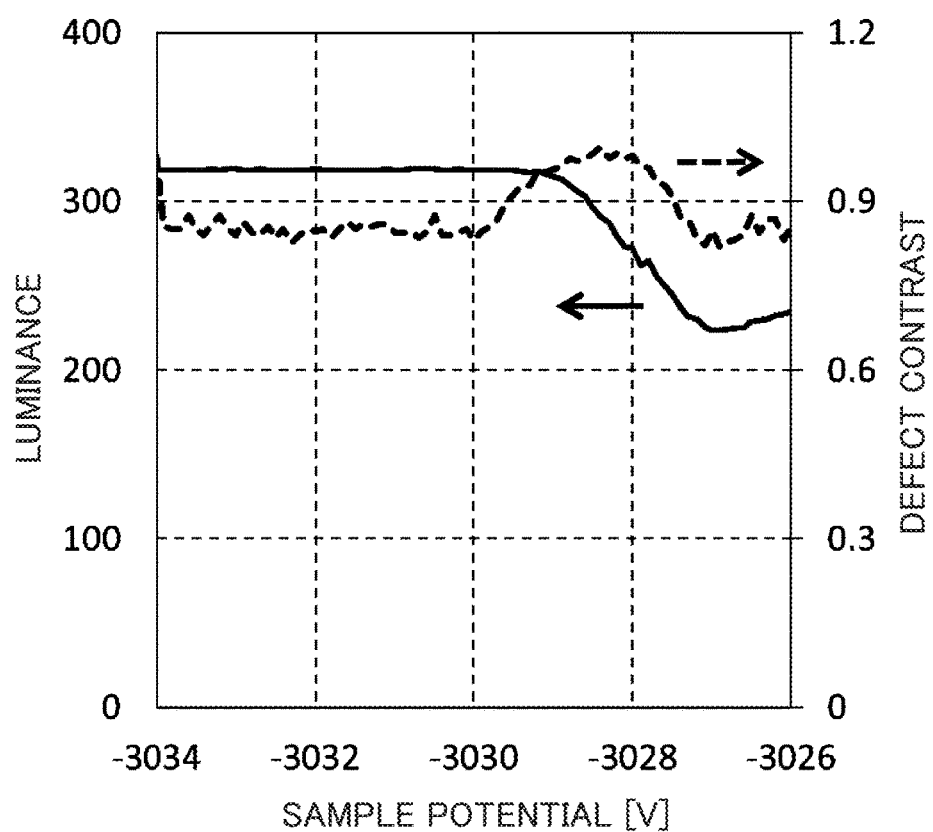
FIG. 9 is a diagram illustrating an example of a change in average image luminance and a change in defect contrast in the case where the sample potential is changed under the condition that the accelerating voltage is fixed according to the first embodiment.

The defect contrast=the defect luminance difference/ the average image luminance FIG. 9 is obtained by setting the defect contrast of the defect that is illustrated in FIG. 8 in the graph of the average image luminance for the sample potential obtained as illustrated in FIG. 7. In this Fig., the defect contrast starts rising when the sample potential is approximately −3030V immediately before the start of a decrease in the luminance. The defect contrast is at its peak when the sample potential is approximately −3028V and the luminance already starts decreasing. After that, as the luminance decreases, the defect contrast decreases. Finally, the defect contrast is equivalent with the value of the defect contrast when the sample potential is −3030V or lower and the luminance starts decreasing. As is apparent from this, mirror electrons start colliding with the substrate, and the contrast of the defect is at its maximum for the sample potential obtained when the luminance starts decreasing. Specifically, the sample potential when the luminance starts decreasing or ΔE is treated as a set potential. After the graph of the average image luminance is obtained as illustrated in FIG. 9, it is preferable to calculate the set potential for the brightness defined as the start of the decrease in the luminance and transmit the set potential to the substrate voltage control device 44. The luminance value defined as the start of the decrease in the luminance may be defined as the start of the decrease in the luminance when the luminance decreases to several tens of percent of the luminance obtained when the mirror electrons are 100% reflected. Alternatively, the luminance value when data returned by the image processing device 45 is lower than luminance of, for example, 300 is defined as the start of the decrease in the luminance. In addition, since relationships between the sample potential or ΔE and the luminance vary depending on the substrate or the type of a defect to be observed, definitions may exist for types of substrates or types of defects. For example, for a latent scratch on the SiC substrate, the luminance value when the average image luminance is 90% is defined as the start of the decrease in the luminance.

Figure 10:
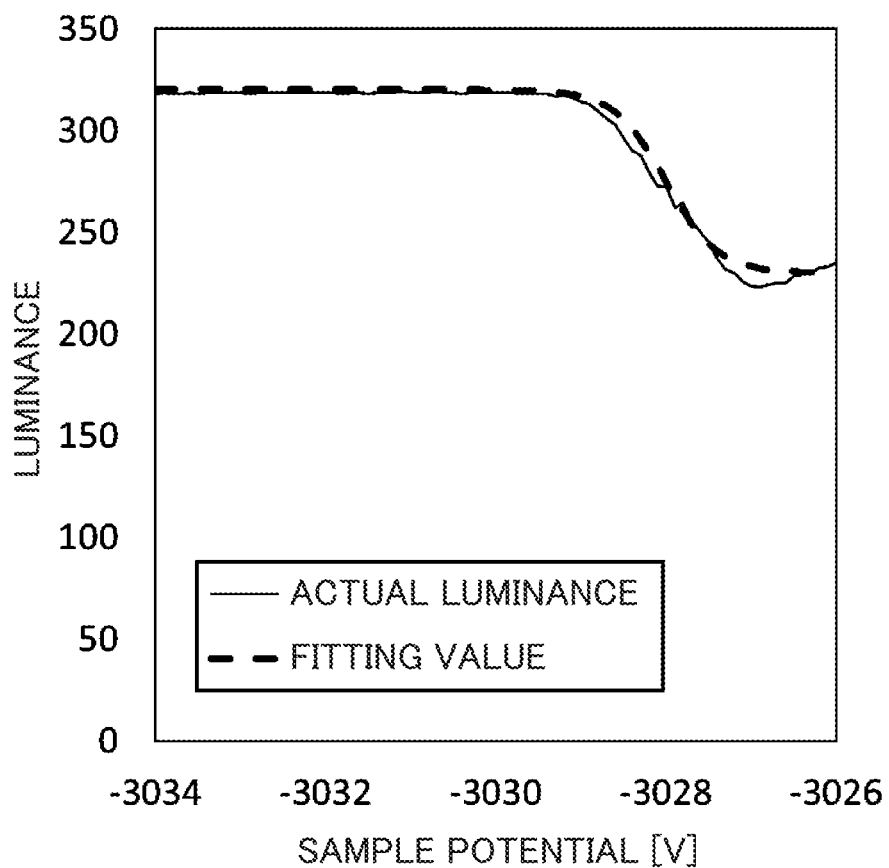
FIG. 10 is a diagram illustrating an example in which relationships between the sample potential and the average image luminance under the condition that the accelerating voltage is fixed are subjected to fitting using a Fermi distribution function according to the first embodiment.

A method for using a certain distribution to perform the fitting on the relationships between the sample potential and the luminance and standardize the relationships and determining the start of a decrease in the luminance is described with reference to FIG. 10. FIG. 10 illustrates a display screen displayed on the image display unit of the image processing device 45. The image display unit can display average image luminance for an image of mirror electrons for the sample potential applied to the sample due to the second voltage. Specifically, a solid line illustrated in this figure indicates relationships between the sample potential and the average image luminance that are obtained from an experiment. The solid line illustrated in this figure indicates the same values as those indicated by a solid line illustrated in FIG. 9. In addition, a dotted line is obtained by performing the fitting using the distribution function. In this case, as the distribution function, a modified Fermi distribution function expressed according to Equation 1 is used.

$$f(V) = A_0 - \frac{A_1}{1 + \exp[(V-\mu)/kT]} \quad \text{Equation 1}$$

In Equation 1, V is the sample potential, k is a Boltzmann constant, a parameter μ is a chemical potential of the Fermi distribution function, a parameter A is a prefactor, and a parameter T is a temperature. As the parameter A, values obtained by performing the fitting on experimental values indicated by the solid line are fitting values indicated by the dotted line in this figure. The experimental values are subjected to the fitting using the distribution function. Thus, for example, when the sample potential is set when the luminance is 90% of the luminance obtained when the mirror electrons are 100% reflected as described above, the set value can be uniquely determined. As described above, the sample potential or ΔF can be automatically adjusted using the configuration of the charged particle beam device according to the present embodiment.

Second Embodiment

A second embodiment is an embodiment of a setting screen to be used by a user to automatically set the difference ΔE, described in the first embodiment, between the electron accelerating voltage and the sample potential. Although the present embodiment describes the case where the sample potential is changed while the electron accelerating voltage is fixed in the same manner as the first embodiment, the electron accelerating voltage and the sample potential may be set after the calculation of the difference ΔE between the electron accelerating voltage and the sample potential, or the sample potential may be set for the electron accelerating voltage.

Figure 11:
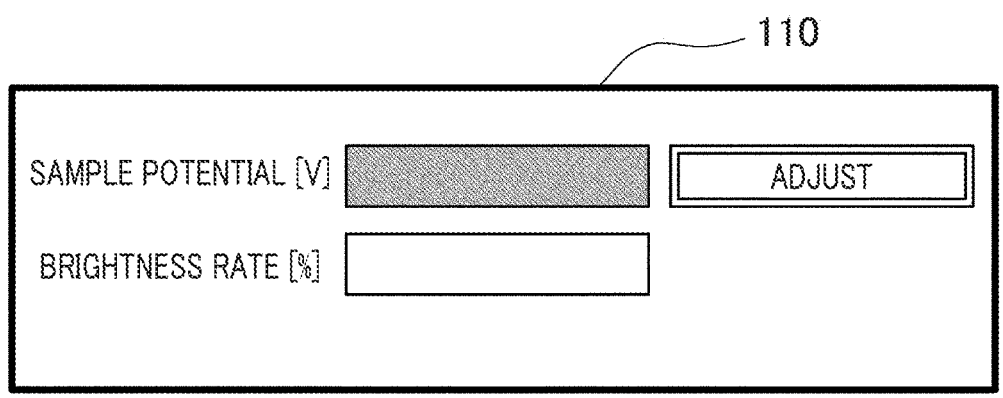
FIG. 11 is a diagram illustrating an example of a screen for inputting parameters for adjusting the difference ΔE between the accelerating voltage and the sample potential according to the second embodiment.

FIG. 11 illustrates a setting screen 110 to be used to set the sample potential in a state in which the electron accelerating voltage is fixed. For the screen display, a display device may be attached to the image processing device 45 according to the first embodiment, as described above, or may be installed separately from the image processing device 45. As illustrated in this figure, the image display unit can display a setting screen for setting a brightness ratio of average image luminance for an image of mirror electrons to luminance obtained when mirror electrons are 100% reflected. Traditionally, the position of a reflection surface is determined by directly entering a set potential in a field for setting a sample potential or an accelerating potential of an electron beam. In the present embodiment, a threshold for luminance, which is described with reference to FIG. 7, is the rate of a decrease from the luminance obtained under the condition that mirror electrons are 100% reflected or is, for example, 90%. After the threshold for luminance is set in a "brightness rate" field of the setting screen 110, the sample potential is automatically set by pressing an adjust button illustrated in FIG. 11. In this case, when the relationships between the sample potential and the average luminance that are described with reference to FIG. 7 are subjected to the fitting using the distribution function as illustrated in FIG. 9, a parameter is determined, and a method for calculating backward the sample potential using the distribution function for which the threshold and the parameter have been determined is used, the sample potential can be uniquely determined. It is preferable that the determined sample potential be displayed on the screen and able to be confirmed by the user.

Figure 12:
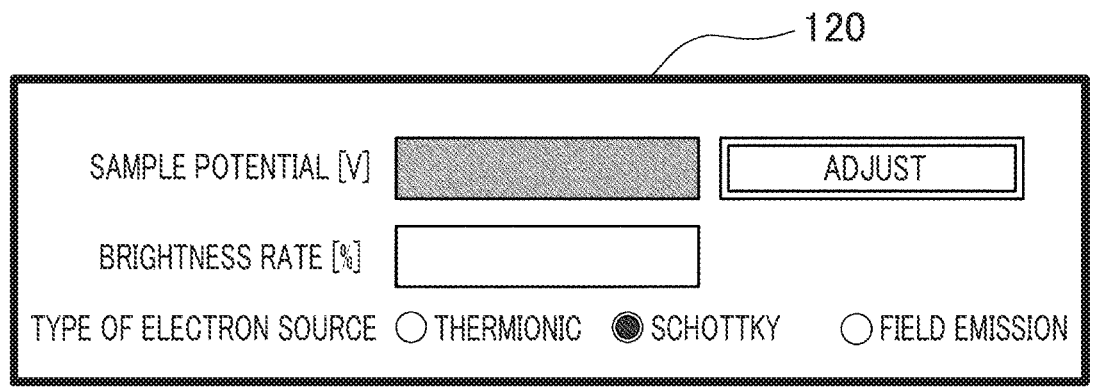
FIG. 12 is a diagram illustrating an example of a screen for inputting parameters for adjusting the difference ΔE between the accelerating voltage and the sample potential according to the second embodiment.

On a setting screen 120 illustrated in FIG. 12, thermionic, Schottky, or field emission can be selected as the type of the electron source, differently from FIG. 11. Specifically, the image display unit can display a setting screen for setting the type of the charged particle source. In the first embodiment, the Fermi distribution function is used as the distribution function. It is, however, preferable that a function that reproduces a luminance distribution be separately set based on operating principles of the electron source. Thus, the type of the electron source that is used on the screen display can be selected and a distribution function for the selected electron source is used. The electron source may be selected on the screen illustrated in FIG. 12 or may be selected using a switch attached to the device. Alternatively, the type of the electron source may be automatically detected in the device and the distribution function may be changed. In addition, the type of the electron source can be automatically selected based on the relationships between the sample potential and the luminance, and the distribution function can be changed. Furthermore, the selection is not limited to only the type of the electron source. A selection field or an automatic selection mechanism may be provided for the type of the sample, and a mechanism for changing the distribution function based on the selection may be provided.

When the electron source is of the field emission type, a distribution on a high voltage side with respect to a peak is different from a distribution on a low voltage side with respect to the peak, the distribution function is expressed based on the sum of differentials of two Fermi distribution functions, as expressed by, for example, Equation 2.

$$f_1(E) + f_2(E) \begin{cases} f_1(E) = 0 & (E < E_0) \\ f_2(E) = 0 & (E > E_0) \end{cases} \quad \text{Equation 2}$$

In Equation 2, fn(E) indicates a differential of one Fermi distribution function.

Figure 13:
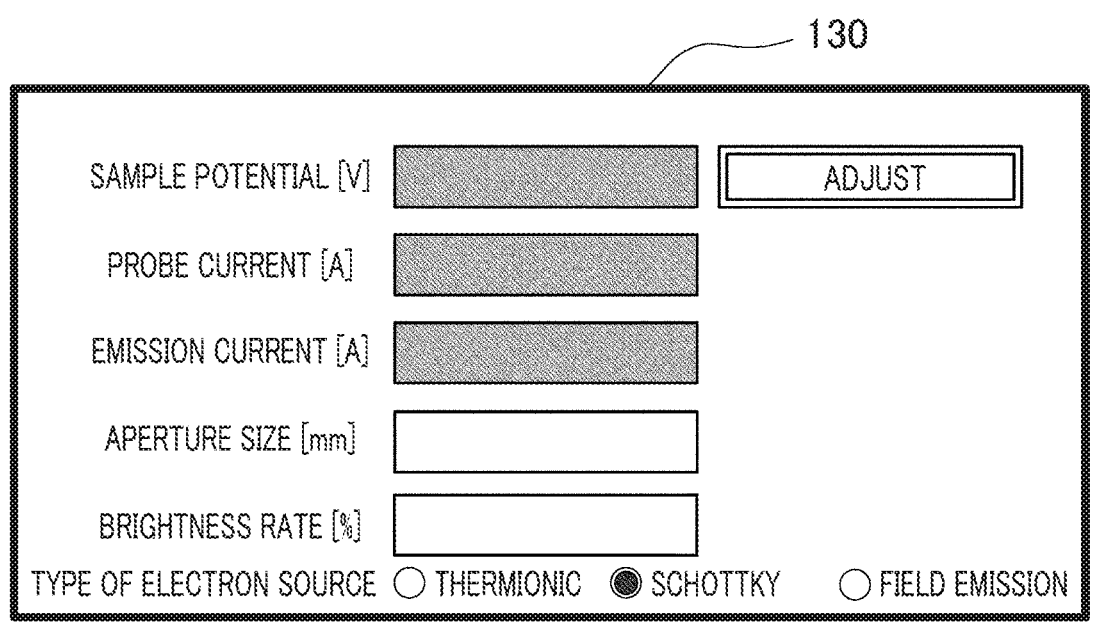
FIG. 13 is a diagram illustrating an example of a screen for inputting parameters for adjusting the difference ΔE between the accelerating voltage and the sample potential according to the second embodiment.

A setting screen 130 illustrated in FIG. 13 has a screen configuration for acquiring not only the type of the electron source but also states of electrons released from the electron source and changing the distribution. As indices to be used to measure states of electrons, a probe current and an emission current are used, as illustrated in this figure. Information of an energy range of emitted electrons is estimated from the probe current, the emission current, an aperture size set for the irradiating system, and an opening angle able to be read from a current value of the irradiation lens. A distribution function to be used to perform the fitting on the sample potential and the average luminance is selected. Since it is assumed that the switching of the aperture size is manually performed, the aperture size is switched using an input field. In this figure, the switching of the aperture may be automatically performed, a method for obtaining the diameter of the aperture may be installed in the device, and the aperture size may be automatically input.

Figure 14:
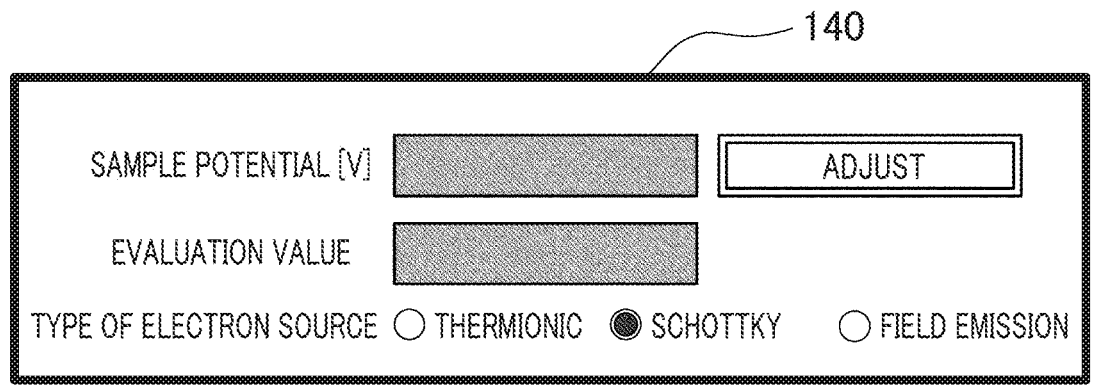
FIG. 14 is a diagram illustrating an example of a screen for inputting parameters for adjusting the difference ΔE between the accelerating voltage and the sample potential according to the second embodiment.

A setting screen 140 illustrated in FIG. 14 is an example of a display screen for the case where a method for calculating an evaluation value of an image based on the relationships between the sample potential and the luminance and the type of the electron source, instead of a threshold for the brightness, and changing the sample potential to maximize the evaluation value is used. As emitted electrons are closer to the reflection surface, a defect image is clearer. Thus, the evaluation value is calculated from the ratio of the quantity, calculated from the average image luminance, of mirror electrons and a distance from the reflection surface. When the adjust button is pressed, the sample potential is set so that the evaluation value is at its maximum and the obtained defect image is clear. An example of the evaluation value is described in a third embodiment.

Figure 15:
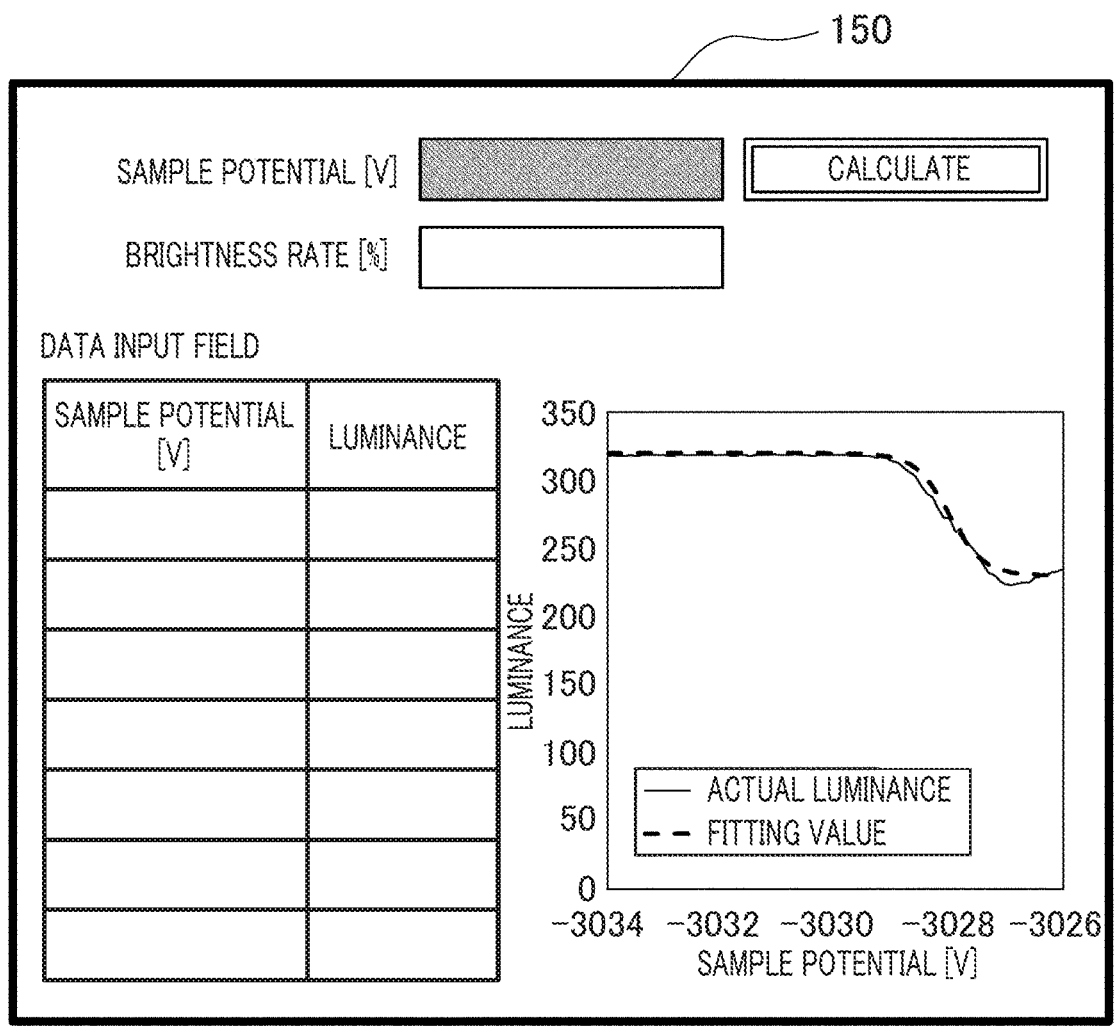
FIG. 15 is a diagram illustrating an example of a calculation tool screen for manually adjusting the difference ΔE between the accelerating voltage and the sample potential according to the second embodiment.

FIG. 15 illustrates, as a setting screen 150, an example of a screen configuration of a sample potential analysis tool as a method for manually analyzing the sample potential from the relationships, obtained by the device, between the sample potential and the luminance. In this case, the relationships, obtained by the device, between the sample potential and the luminance are automatically input to a data input field, or values acquired and displayed by the device are manually input, a fitting process is performed by pressing a calculate button, and the sample potential is displayed. By inputting and setting the displayed sample potential to a traditional sample potential setting field, the sample potential can be set to the optimal potential. When this method is selected, for example, an average luminance value can be corrected for an image in which an error has occurred in the acquisition of the image. In addition, when a row of the data input field of the setting screen 150 is selected, an image for which luminance has been calculated can be displayed and the user can confirm whether an abnormality exists in the image and determine whether the image is used as data.

Third Embodiment

Figure 16:
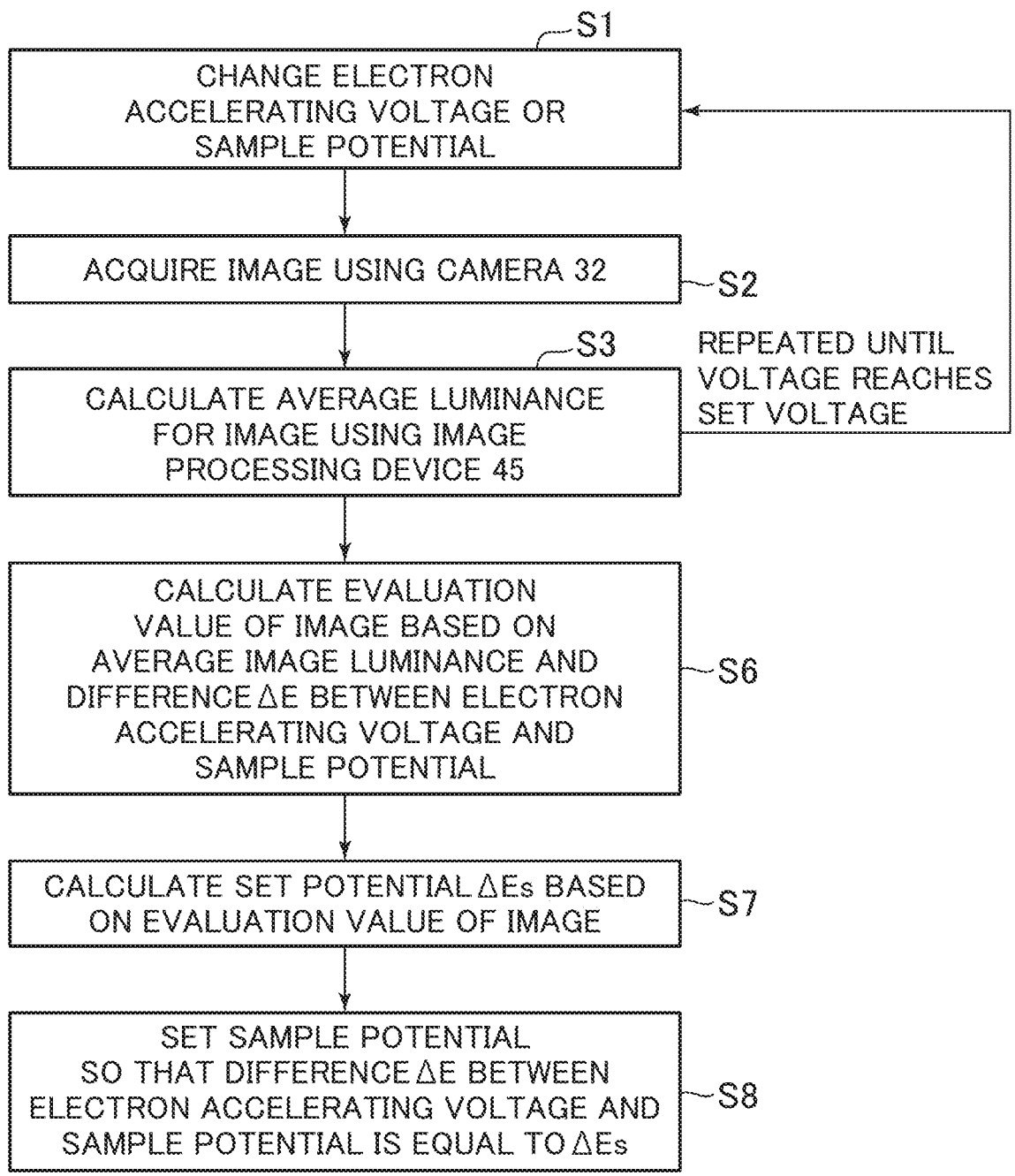
FIG. 16 is a flowchart of a method for adjusting the difference ΔE between the accelerating voltage and the sample potential using an evaluation value of an image according to a third embodiment.

In the third embodiment, based on relationships between the sample potential and average luminance, an evaluation value is calculated and the sample potential is automatically set. FIG. 16 illustrates an algorithm for calculating the sample potential according to the present embodiment. As described with reference to FIG. 5, first, the electron accelerating voltage or the sample potential is changed (in S1), an image is acquired by the camera 32 (in S2), average luminance for the image is calculated by the image processing device 45 (in S3), and the relationships between the sample potential and the average image luminance are acquired as illustrated in FIG. 6. An evaluation value is calculated for the difference ΔE between each electron accelerating voltage and the sample potential based on the acquired relationships (in S6). Then, ΔEs, which is ΔE that maximizes the evaluation value, is acquired (in S7), and the electron accelerating voltage and the sample potential are set so that the difference between the electron accelerating voltage and the sample potential is ΔEs (in S8). The present embodiment describes below an example of a method for calculating the evaluation value and describes the case where ΔE can be automatically adjusted using only the average luminance.

Figure 17A:
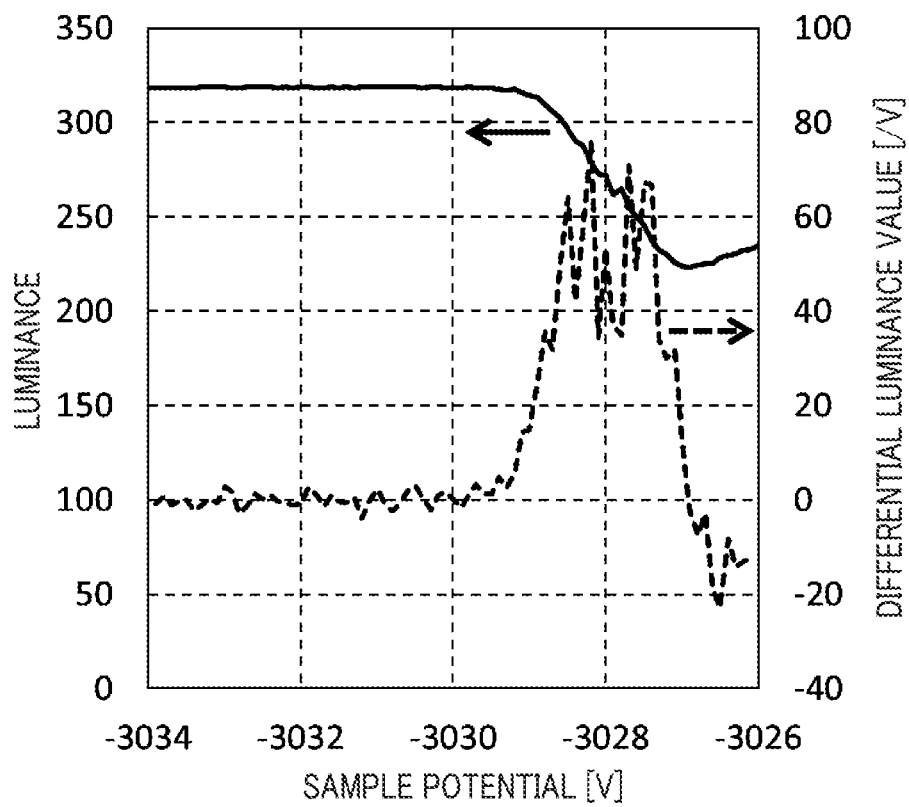
FIGS. 17A and 17B are diagrams illustrating an example of average image luminance, a differential luminance value, and an individual evaluation value in the case where the sample potential is changed under the condition that the accelerating voltage is fixed according to the third embodiment.
Figure 17B:
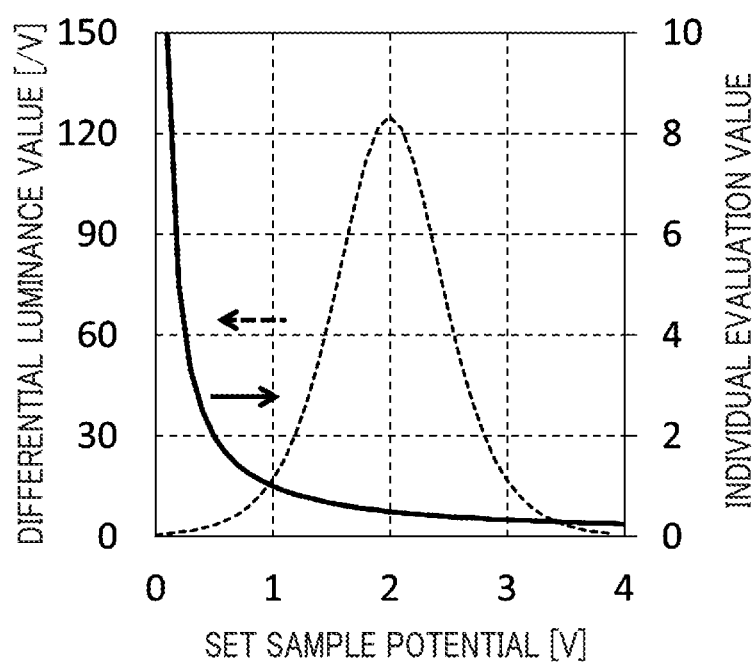

FIG. 17 illustrate relationships among the sample potential illustrated in FIG. 6, the luminance illustrated in FIG. 6, and a differential luminance value and relationships among a set sample potential, the differential luminance value, and an individual evaluation value. A solid line illustrated in FIG. 17(*a*) indicates the relationships between the sample potential and the average image luminance, and a dotted line indicates the differential luminance value. It is considered that the differential luminance value indicated by the dotted line indicates an energy distribution of emitted electrons in a region in which there is no effect of secondary electrons and reflected electrons. In the present embodiment, a Schottky electron gun is used as the electron gun, but a differential form of the Fermi distribution function is used as a fitting function for the differential luminance value considered to indicate the energy distribution. In the case where the Schottky electron gun is used, an evaluation value can be calculated with higher accuracy by selecting a distribution function based on the estimated energy distribution. However, a Fermi distribution is used for simplicity in this case.

FIG. 17(*b*) illustrates an individual evaluation value calculated based on the Fermi distribution function calculated using FIG. 17(*a*) and the set sample potential. The set sample potential indicated by an abscissa in FIG. 17(*b*) is displayed using −3030V illustrated in FIG. 17(*a*) as a standard (0V). A dotted line indicated in FIG. 17(*b*) indicates a value obtained by fitting the differential luminance value indicated by the dotted line in FIG. 17(*a*) using a differential form of the Fermi distribution function, while −3030V is used as a standard (0V). In addition, it is considered that, as mirror electrons are closer to the sample, an effect of a distortion, caused by charges of the charged sample, of the equipotential surface is larger. As the individual evaluation value, a function that is larger as mirror electrons are closer to the sample is set. Specifically, the individual evaluation value is set to 1/E, while E is the set sample potential indicated by the abscissa in FIG. 17(*b*). By performing convolution on the differential luminance value and the individual evaluation value, the individual evaluation value is set to an evaluation value when the set sample potential is −3030V. As a function of the individual evaluation value is closer to 0, the function more diverges. Thus, the evaluation value is calculated by performing numerical integration at intervals of 0.1V.

Figure 18:
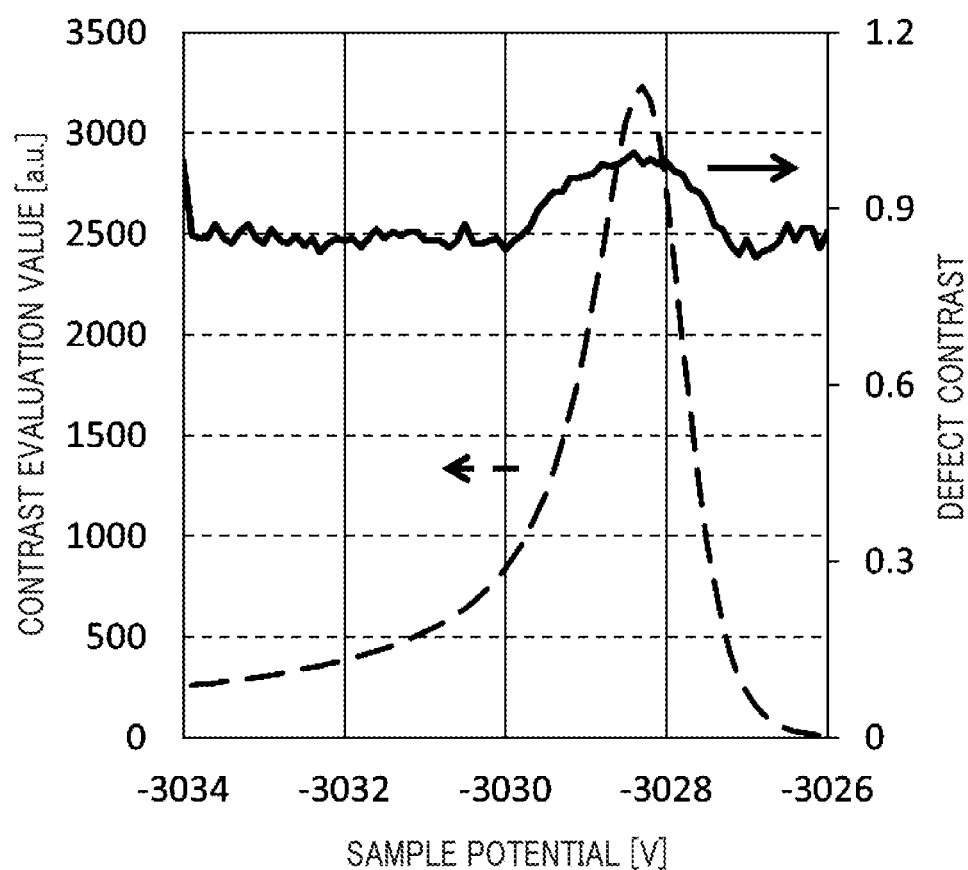
FIG. 18 is a diagram illustrating an example of defect contrast and a contrast evaluation value in the case where the sample potential is changed under the condition that the accelerating voltage is fixed according to the third embodiment.

FIG. 18 illustrates the comparison of the defect contrast defined as described above with a contrast evaluation value calculated as a result of the convolution. The peak of the evaluation value is approximately −3028.3V and is different from −3028.4V by 0.1V. The voltage of −3028.4V is the peak value of the defect contrast. By performing optimization using the evaluation value, the sample potential can be set so that the defect contrast is the optimal value. Furthermore, by accurately reproducing the energy distribution of the Schottky electron source, the evaluation can be performed with higher accuracy. By using the configuration and mechanism according to the third embodiment described above, the sample potential can be automatically set so that the defect contrast is the optimal value, compared to the case where only average screen luminance is used.

Fourth Embodiment

Figure 19:
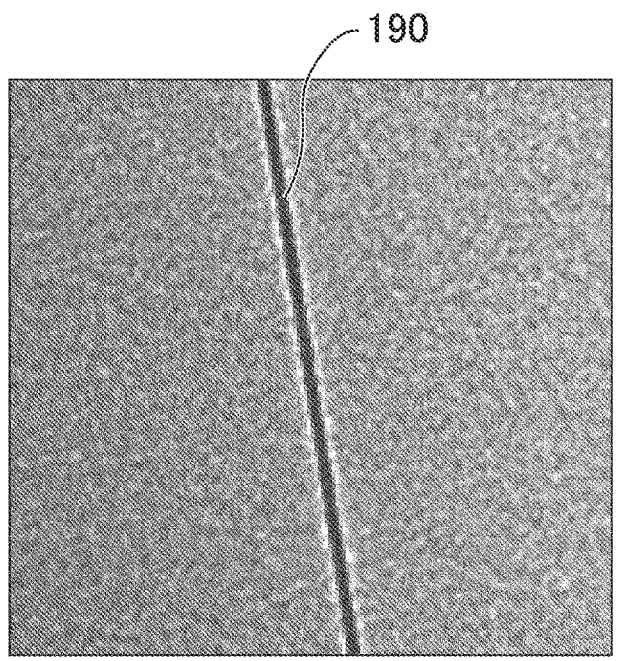
FIG. 19 is a diagram illustrating an example of a mirror electron microscope image in the case where a latent scratch in an SiC substrate is observed according to a fourth embodiment.

In the present embodiment, the invention is applied to a latent scratch defect detecting device for detecting a latent scratch defect of an SiC substrate. FIG. 19 illustrates a mirror electron microscope image of a latent scratch that is one of crystal defects existing in the SiC substrate. The latent scratch 190 is a linear crystal defect displayed with contrast in the mirror electron microscope image. As illustrated in FIG. 19, the latent scratch 190 has a long black portion extending in a single direction, and an edge of the black portion is displayed as a white contrast portion. This is due to the fact that, in the mirror electron microscope, the SiC substrate is irradiated with an ultraviolet beam having energy equal to or higher than a bandgap, negatively charged, and imaged under the condition that mirror electrons reflected on a distortion, caused by a defect, of a reflection surface are defocused by the imaging system. In the present embodiment, regarding the amount of defocusing, the defocusing is performed in a state in which the focal surface is separated from the scintillator 33 by 10 mm or more, and imaging is performed so that a defect image is enlarged.

In the following process, a mirror electron image is acquired by the mirror electron microscope, and the latent scratch is subjected to defect inspection. First, a wafer is introduced in a load-lock chamber, exposed to a vacuum environment, and moved to a position right under a microscope tube of the electron microscope. The wafer is moved so that a portion of the wafer that is to be subjected to defect detection is located at a position right under the microscope tube of the electron microscope. The wafer may be moved using coordinates or may be moved while being observed using an optical microscope separately prepared or the like. Next, voltages are applied to the objective lens and the sample. When the voltages are applied, the electron beam is introduced and emitted by the irradiating system toward the sample, and an electron beam image is captured by the camera. In the adjustment of the sample potential after that, while the sample potential is changed, electron beam images are sequentially captured, average image brightness is calculated from the electron beam images, and a graph of the sample potential and the average image brightness is created. The graph of the sample potential and the average image brightness is subjected to the fitting using the Fermi distribution function, and the sample potential when the brightness is a defined value is calculated based on the Fermi distribution function and a calculated fitting parameter. For a latent scratch, brightness of 90% is defined. After the sample potential is set to the calculated sample potential, electron beam images are captured by the camera. When a wide range is to be imaged, the stage is moved and a next electron image is captured. It is sufficient if the sample potential is calculated once before measurement. The height of a wafer is measured in the movement of the stage. When a shift is large, the intensity of the objective lens or the intensity of the imaging lens is changed to set the amount of defocusing to a fixed amount. In the foregoing process, the latent scratch of the SiC substrate can be detected. The present embodiment is applicable to not only the scratch defect inspection performed on the SiC but also the detection of another crystal defect on the SiC and the detection of a defect existing on another GaN substrate or the like.

The invention is not limited to the foregoing embodiments and includes various modified examples. For example, the embodiments are described in detail to clearly understand the invention and may not necessarily include all the configurations described. In addition, some of configurations described in a certain embodiment may be replaced with configurations described in another embodiment. Furthermore, a configuration described in a certain embodiment may be added to a configuration described in another embodiment. Furthermore, some of configurations described in each of the embodiments may be added to or replaced with other configurations described in the other embodiments, and some of configurations described in each of the embodiments may be removed.

Furthermore, although an example in which the program for enabling some or all of the foregoing configurations, the foregoing functions, the control device, the image processing device, and the like is created is described, it goes without saying that some or all of the foregoing configurations, the foregoing functions, the control device, the image processing device, and the like may be enabled by hardware such or by designing an integrated circuit or the like. Specifically, functions of all or some of the processing units may be enabled by, for example, an integrated circuit such as an application specific integrated circuit (ASIC) or a field programmable gate array (FPGA), instead of the program.

LIST OF REFERENCE SIGNS

10 Optical axis of irradiating system
11 Optical axis of imaging system
12 Optical axis of objective lens
20 Electron gun
21 Irradiation lens
22 Imaging lens
23 Objective lens
24 Beam separator
30 Sample
31 Stage
32 Camera
33 Scintillator
40 Control device
41 Electron gun control device
42 Image acquiring device
43 Ultraviolet light source control device
44 Substrate voltage control device
45 Image processing device
50 Ultraviolet light source
100 Crystal defect
110, 120, 130, 140, 150 Setting screen
190 Latent scratch

The invention claimed is:
1. A charged particle beam device comprising:
  a charged particle source that emits charged particles to a sample;
  a first power source that applies a first voltage to the charged particle source;
  a second power source that applies a second voltage to the sample;
  an image forming optical system that images charged particles incident from a direction in which the sample exists;
  a detector that is installed in the image forming optical system and detects the charged particles; and an imaging processing device to which a signal of the detector is input, wherein the image forming optical system is configured so that the image forming optical system does not image secondary electrons released from the sample and forms an image of mirror electrons returned by an electric field generated at the sample due to a potential difference between the first and second voltages first and second voltages, and wherein the image processing device is configured to adjust the potential difference between the first and second voltages, based on a function of variables that decrease with the image luminance and the potential difference, or a convolution function including the variables.

2. The charged particle beam device according to claim 1, wherein a focal surface for the secondary electrons is separated from an imaging surface of the detector by 10 millimeters or more.

3. The charged particle beam device according to claim 1, wherein a sample potential of the sample has a value at which average image luminance for the image of the mirror electrons is 90% of luminance obtained when the mirror electrons are 100% reflected.

4. The charged particle beam device according to claim 1, wherein the image processing device is configured to calculate an evaluation value based on the potential difference between the first and second voltages and the distribution of the amounts of the signals of the detector and to adjust the potential difference between the first and second voltages based on the evaluation value.

5. The charged particle beam device according to claim 1, wherein the image processing device is configured to perform fitting using a distribution function to analyze the distribution of the amounts of the signals of the detector.

6. The charged particle beam device according to claim 5, wherein the image processing device is configured to change the distribution function based on the type of the charged particle source.

7. The charged particle beam device according to claim 5, wherein the image processing device is configured to acquire information of the charged particle source and to change the distribution function.

8. The charged particle beam device according to claim 7, wherein the information of the charged particle source indicates a voltage applied to the charged particle source or a current supplied to the charged particle source.

9. The charged particle beam device according to claim 5, wherein the image processing device is configured to change the distribution function based on a target that exists on the sample and is to be observed.

10. The charged particle beam device according to claim 5, wherein the distribution function is a Fermi distribution function or a differential function of the Fermi distribution function.

11. The charged particle beam device according to claim 1, further comprising:

an image display unit that displays the image, formed by the image processing device, of the mirror electrons.

12. The charged particle beam device according to claim 11, wherein the image display unit is configured to display average image luminance for the image of the mirror electrons for the sample potential applied to the sample due to the second voltage.

13. The charged particle beam device according to claim 11, wherein the image display unit is configured to display a setting screen for setting a brightness ratio of average image luminance for the image of the mirror electrons to luminance obtained when the mirror electrons are 100% reflected.

14. The charged particle beam device according to claim 11, wherein the image display unit is configured to display a setting screen for setting the type of the charged particle source.

* * * * *